(12) United States Patent
Zhu (10) Patent No.: US 10,405,436 B2
(45) Date of Patent: Sep. 3, 2019

(54) FLEXIBLE DISPLAY MODULE BONDING METHOD

(71) Applicant: SHENZHEN ROYOLE TECHNOLOGIES CO. LTD., Shenzhen, Guangdong (CN)

(72) Inventor: Jianlei Zhu, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 90 days.

(21) Appl. No.: 15/580,289

(22) PCT Filed: Dec. 11, 2015

(86) PCT No.: PCT/CN2015/097206
§ 371 (c)(1),
(2) Date: Dec. 7, 2017

(87) PCT Pub. No.: WO2017/096627
PCT Pub. Date: Jun. 15, 2017

(65) Prior Publication Data
US 2018/0168050 A1  Jun. 14, 2018

(51) Int. Cl.
*H05K 3/36* (2006.01)
*G02F 1/13* (2006.01)
(Continued)

(52) U.S. Cl.
CPC ............... *H05K 3/363* (2013.01); *B32B 7/12* (2013.01); *B32B 37/025* (2013.01); *G02F 1/13* (2013.01);
(Continued)

(58) Field of Classification Search
CPC .... B32B 2037/1253; B32B 2310/0831; B32B 2457/20; B32B 37/025; B32B 37/12;
(Continued)

(56) References Cited

U.S. PATENT DOCUMENTS

| 2010/0261012 A1 | 10/2010 | Huang |
| 2018/0207922 A1* | 7/2018 | Zhang .................. B32B 37/025 |

FOREIGN PATENT DOCUMENTS

| CN | 101614926 | 12/2009 |
| CN | 104167429 | 11/2014 |

(Continued)

OTHER PUBLICATIONS

English translation of Written Opinion of PCT/CN2015/097206.*
(Continued)

*Primary Examiner* — Sonya M Sengupta
(74) *Attorney, Agent, or Firm* — Hauptman Ham, LLP (57) ABSTRACT

A bonding method of a flexible display module is provided. The flexible display module includes a flexible display panel having a first bonding area and an integrated driving circuit having a second bonding area. The bonding method includes: attaching, through a colloid, a transfer plate to a surface of the flexible display panel; solidifying the colloid facing the first bonding area to form a fixed portion; flattening the transfer plate to flatten the first bonding area through the fixed portion; aligning the second bonding area with the first bonding area pre-laminating the first bonding area and the second bonding area at a first temperature; breaking the fixed portion, and separating the flexible display panel and the transfer plate; flattening the flexible display panel; laminating the first bonding area and the second bonding area at a second temperature to form the flexible display module.

11 Claims, 6 Drawing Sheets

(51) Int. Cl.
    *B32B 7/12*     (2006.01)
    *B32B 37/00*     (2006.01)
    *G06F 1/16*     (2006.01)
    *H04M 1/02*     (2006.01)
    *H05K 1/18*     (2006.01)
    *H05K 3/32*     (2006.01)
    *B32B 37/12*     (2006.01)
    *B32B 38/18*     (2006.01)
    *G09F 9/30*     (2006.01)

(52) U.S. Cl.
    CPC ........ *G06F 1/1652* (2013.01); *H04M 1/0268* (2013.01); *H05K 1/189* (2013.01); *H05K 3/323* (2013.01); *B32B 37/12* (2013.01); *B32B 38/1858* (2013.01); *B32B 2037/1253* (2013.01); *B32B 2310/0831* (2013.01); *B32B 2457/20* (2013.01); *G02F 1/1303* (2013.01); *G09F 9/301* (2013.01); *H05K 2201/10128* (2013.01); *H05K 2203/0165* (2013.01); *H05K 2203/068* (2013.01); *H05K 2203/1581* (2013.01); *H05K 2203/166* (2013.01); *H05K 2203/167* (2013.01)

(58) Field of Classification Search
    CPC ...... B32B 38/1858; B32B 7/12; H05K 1/189; H05K 2201/10128; H05K 2203/0165; H05K 2203/068; H05K 2203/1581; H05K 2203/166; H05K 2203/167; H05K 3/323; H05K 3/363; H04M 1/0268; G02F 1/13; G02F 1/1303; G06F 1/1652; G09F 9/301
    USPC .................................... 156/235, 272.2, 285
See application file for complete search history.

(56) References Cited

FOREIGN PATENT DOCUMENTS

| | | |
|---|---|---|
| CN | 104752443 | 7/2015 |
| KR | 20140080238 | 6/2014 |
| WO | 2015008642 | 1/2015 |

OTHER PUBLICATIONS

English translation of CN102707465.*
International search report dated Jun. 28, 2016 from corresponding application No. PCT/CN2015/097206.

* cited by examiner

FLEXIBLE DISPLAY MODULE BONDING METHOD

RELATED APPLICATIONS

The present application is a National Phase of International Application Number PCT/CN2015/097206, filed Dec. 11, 2015.

TECHNICAL FIELD

The present disclosure relates to the technical field of flexible display modules, and particularly to a bonding method of a flexible display module.

BACKGROUND

With the development of display technologies, flexible display modules have more and more applications. The existing flexible display modules mainly include a flexible display panel and a corresponding drive circuit. After the flexible display panel is manufactured, an external drive chip needs to be connected through an electrically conductive medium on the flexible display panel, which process is generally called as bonding. The electrically conductive medium used for realizing the connection in the bonding process is generally an anisotropic conductive film (ACF), which is characterized by realizing the electrical conduction just in a direction under pressure, while being not conductive in other directions which are not under pressure. However, if the bonding is carried out directly on the flexible display panel, the flexible display panel is prone to deformation due to the high-temperature and high-pressure environment in the bonding process, and inaccurate bonding alignment also may occur, seriously affecting the quality of products.

In order to solve the above problems, insiders usually firstly attach, through a colloid, the flexible display panel to a rigid bearing plate, then perform the bonding, and finally strip the flexible display panel from the rigid bearing plate using a laser scanning method. However, there appears a new problem when stripping the flexible display panel: since the temperature of the lamination in the bonding process is mostly between 150 degrees and 200 degrees, the colloid currently arranged between the flexible display panel and the rigid bearing panel may be affected, so that the solidification state of the colloid located in the bonding area may be changed, and it is difficult to strip the colloid subsequently using the laser. At this point, the amount of the laser should be increased to enhance the decomposition of the colloid, but the increase of the laser radiation amount and time may cause a flexible substrate of the flexible display panel to carbonize and deform, creating numerous particulates, even affecting the performances of thin film transistor (TFT) devices and circuits of the flexible display panel, and finally leading to a low yield rate of the flexible display module.

SUMMARY

Embodiments of the present disclosure provide a bonding method of a flexible display module with a high yield rate.

In order to realize the above object, the embodiments of the present disclosure adopt the following technical solution.

A bonding method of a flexible display module is provided. The flexible display module includes a flexible display panel having a first bonding area and an integrated driving circuit having a second bonding area. The bonding method includes: attaching, through a colloid, a transfer plate to a surface of the flexible display panel which is away from the first bonding area; solidifying the colloid facing the first bonding area to form a fixed portion; flattening the transfer plate to flatten the first bonding area through the fixed portion; aligning the second bonding area with the first bonding area; pre-laminating the first bonding area and the second bonding area at a first temperature; breaking the fixed portion, and separating the flexible display panel and the transfer plate; flattening the flexible display panel; and laminating the first bonding area and the second bonding area at a second temperature.

Preferably, attaching, through the colloid, the transfer plate to the surface of the flexible display panel which is away from the first bonding area includes: flattening the flexible display panel and placing the flexible display panel on a transfer machine platform, a transfer wheel including several vacuum suction holes, absorbing, through the vacuum suction holes, the transfer plate to an outer surface of the transfer wheel, and releasing the vacuum suction holes sequentially when the transfer wheel rolls and presses onto the flexible display panel, so that the transfer plate escapes from the transfer wheel and is attached to the flexible display panel.

Preferably, attaching, through the colloid, the transfer plate to the surface of the flexible display panel which is away from the first bonding area includes: flattening the flexible display panel, a transfer machine platform including several vacuum suction holes, absorbing, through the vacuum suction holes, the flexible display panel to the transfer machine platform, an outer surface of a transfer wheel being provided with the transfer plate, and releasing the vacuum suction holes sequentially when the transfer wheel rolls and presses onto the flexible display panel, so that the flexible display panel escapes from the transfer machine platform and is attached to the transfer plate.

Preferably, flattening the flexible display panel includes: the first bonding area including several strip solder pads, tensioning the solder pads in a length direction of the solder pads.

Preferably, tensioning the solder pads includes: the flexible display panel including a first peripheral side and a second peripheral side opposite to the first peripheral side, the first peripheral side and the second peripheral side both being perpendicular to the length direction of the solder pads; applying a first tensioning force to the first peripheral side, applying a second tensioning force to the second peripheral side, directions of the first tensioning force and the second tensioning force being opposite, and both parallel to the length direction of the solder pads.

Preferably, solidifying the colloid facing the first bonding area to form the fixed portion includes: radiating the colloid by ultraviolet rays to form the fixed portion, the colloid being an ultraviolet ray curing adhesive.

Preferably, radiating the colloid by the ultraviolet rays includes: radiating the colloid which is patterned uniformly by the ultraviolet rays.

Preferably, radiating the colloid by the ultraviolet rays includes: radiating the colloid uniformly coated on the transfer plate by an angle facing the first bonding area via the ultraviolet rays.

Preferably, breaking the fixed portion, and separating the flexible display panel and the transfer plate includes: applying a force away from the flexible display panel to a peripheral side of the transfer plate, so that areas of the transfer plate, with the exception of a portion connected with the fixed portion, are separated from the flexible display panel; and heating or laser-radiating the fixed portion to cause the fixed portion to lose viscosity, so as to separate the flexible display panel and the transfer plate.

Preferably, breaking the fixed portion, and separating the flexible display panel and the transfer plate includes: applying a force away from the flexible display panel to a peripheral side of the transfer plate, and applying a force away from the transfer plate to a peripheral side of the flexible display panel, so that areas of the transfer plate, with the exception of a portion connected with the fixed portion, are separated from the flexible display panel; and heating or laser-radiating the fixed portion to cause the fixed portion to lose viscosity, so as to separate the flexible display panel and the transfer plate.

Compared with the related art, when the flexible display module is manufactured through the bonding method of the present disclosure, the first bonding area of the flexible display panel and the transfer plate are fixed with each other through the fixed portion, therefore, the first bonding area can be driven to be flattened by flattening the transfer plate, thus the problem of difficult bonding alignment caused by inherent extension of dimension of the flexible display panel may not occur, on this basis, it can effectively ensure accurate alignment of the first bonding area with the second bonding area when performing the pre-lamination. After the pre-laminating is completed, that is, the flexible display panel and the transfer plate are separated by breaking the fixed portion, since the first temperature is a low temperature, the solidification state of the fixed portion connected between the flexible display panel and the transfer plate may not be changed, the fixed portion can be easily broken to separate the flexible display panel and the transfer plate, avoiding the problem of damages to a flexible substrate, electronic devices, and circuits of the flexible display panel due to the increase of laser radiation amount and time. Finally, the flexible display panel is laminated after its four sides are flattened so as to form the flexible display module. The flattened flexible display panel maintains good flatness, therefore, an area of the flexible display panel which needs to be laminated can be completely and tightly attached to a platform used for the lamination, so that the first bonding area and the second bonding area can be heated uniformly in the laminating process, further ensuring the alignment accuracy and the bonding quality of the first bonding area and the second bonding area. Therefore, the flexible display module bonded through the above bonding method has a high yield rate.

BRIEF DESCRIPTION OF THE DRAWINGS

In order to illustrate the technical solutions of embodiments of the present disclosure or the related art more clearly, the accompanying drawings used in the description of the embodiments will be briefly described. Apparently, the accompanying drawings described in the following are merely for some embodiments of the present disclosure, and a person ordinarily skilled in the art still can obtain other accompanying drawings according to these accompanying drawings without any creative effort.

DETAILED DESCRIPTION

Below the technical solutions of embodiments of the present disclosure will be described clearly and completely in conjunction with the accompanying drawings of the embodiments of the present disclosure. Apparently, some but not all of embodiments of the present disclosure are described. Based on the embodiments of the present disclosure, all the other embodiments, which a person ordinarily skilled in the art obtains without paying creative effort, fall within the scope of protection of the present disclosure.

Figure 1:
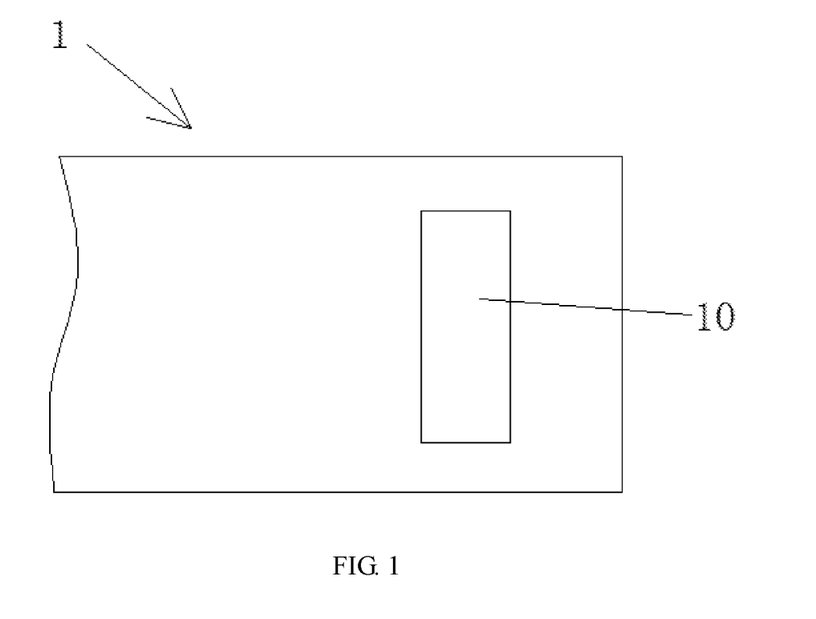
FIG. 1 is a structural schematic view of a flexible display screen used in a bonding method of a flexible display module provided in an embodiment of the present disclosure.
Figure 2:
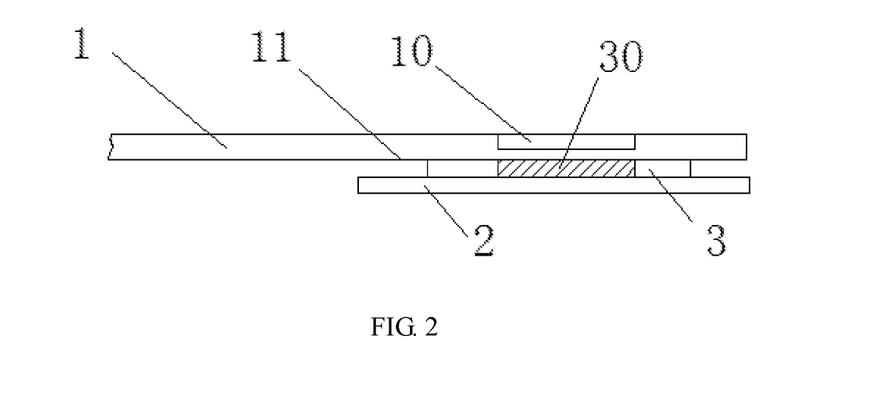
FIG. 2 to FIG. 5 are structural schematic views of manufacturing procedures corresponding to multiple steps in a bonding method of a flexible display module provided in an embodiment of the present disclosure.
Figure 3:
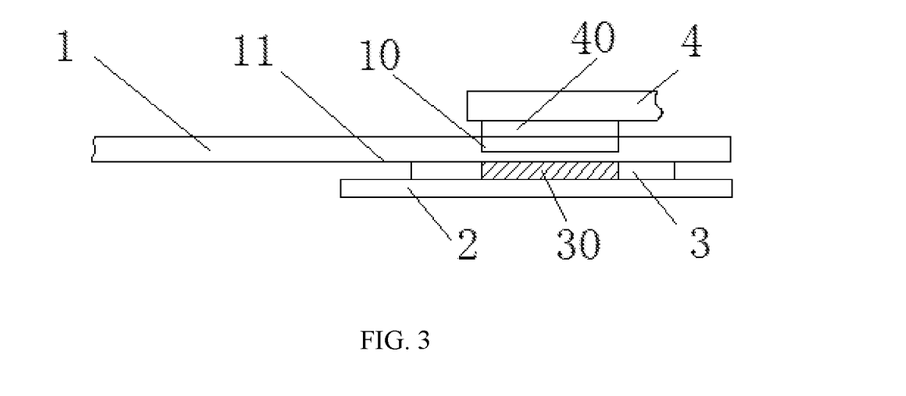

Referring to FIG. 1 to FIG. 5, an embodiment of the present disclosure provides a bonding method of a flexible display module. The flexible display module includes a flexible display panel 1 (as shown in FIG. 1) having a first bonding area 10 and an integrated driving circuit 4 (as shown in FIG. 3) having a second bonding area 40. The bonding method mainly includes the following steps:

Step 1: a transfer plate 2 is attached, through a colloid 3, to a surface 11 of the flexible display panel 1 which is away from the first bonding area 10, and the colloid facing the first bonding area 10 is solidified to form a fixed portion 30. As shown in FIG. 2, a shadow portion in the figure represents the fixed portion 30.

Step 2: the transfer plate 2 is flattened, where the transfer plate 2 is flattened via driving the first bonding area 10 by the fixed portion 30.

Step 3: the second bonding area 40 is aligned with the first bonding area 10, and the second bonding area 40 and the first bonding area 10 are pre-laminated at a first temperature, as shown in FIG. 3.

Figure 4:
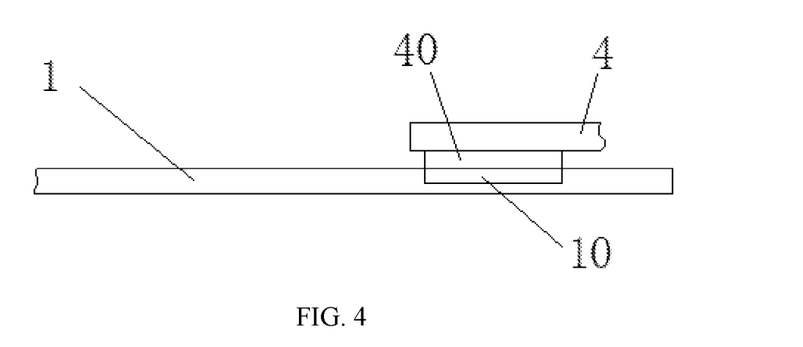

Step 4: the fixed portion is broken, and the flexible display panel 1 and the transfer plate 2 are separated, as shown in FIG. 4.

Step 5: the flexible display panel 1 is flattened, and the second bonding area 40 and the first bonding area 10 are laminated at a second temperature to form the flexible display module.

In the embodiment, the first bonding area 10 of the flexible display panel 1 and the transfer plate 2 are fixed with each other through the fixed portion 30, therefore, the first bonding area 10 can be driven to be flattened by flattening the transfer plate 2, thus the problem of difficult bonding alignment caused by inherent extension of dimension of the flexible display panel 1 can be avoided, on this basis, it can effectively ensure accurate alignment of the first bonding area 10 with the second bonding area 40 when performing the pre-laminating. After the pre-laminating is completed, that is, the flexible display panel 1 and the transfer plate 2 are separated by breaking the fixed portion 30, since the pre-laminating is performed at the first temperature which is defined as a low temperature, including, but not limited to temperatures in a range of 60 degrees to 90 degrees, the solidification state of the fixed portion 30 connected between the flexible display panel 1 and the transfer plate 2 may not be changed, and the fixed portion 30 can be easily broken to separate the flexible display panel 1 and the transfer plate 2, avoiding the problem of damages to a flexible substrate, electronic devices, and circuits of the flexible display panel 1 due to the increase of laser radiation amount and time. Finally, the flexible display panel 1 is flattened, and the second bonding area 40 is laminated with the first bonding area 10 at the second temperature (the second temperature is higher than the first temperature, including, but not limited to temperatures in a range of 150 degrees to 200 degrees), to form the flexible display module. The flattened flexible display panel 1 maintains good flatness, therefore, an area of the flexible display panel 1 which needs to be laminated can be completely and tightly attached to a platform used for the lamination, so that the first bonding area 10 and the second bonding area 40 can be heated uniformly in the laminating process, further ensuring the alignment accuracy and the bonding quality of the first bonding area 10 and the second bonding area 40. Therefore, the flexible display module bonded through the above bonding method has a high yield rate.

It should be understood that "flatten" referred to in the embodiment includes, but not limited to enabling a structure (for example, the transfer plate 2, the first bonding area 10, or the flexible display panel 1) to be flattened to realize a flat state in a manner such as expanding, spreading, and stretching.

Figure 6:
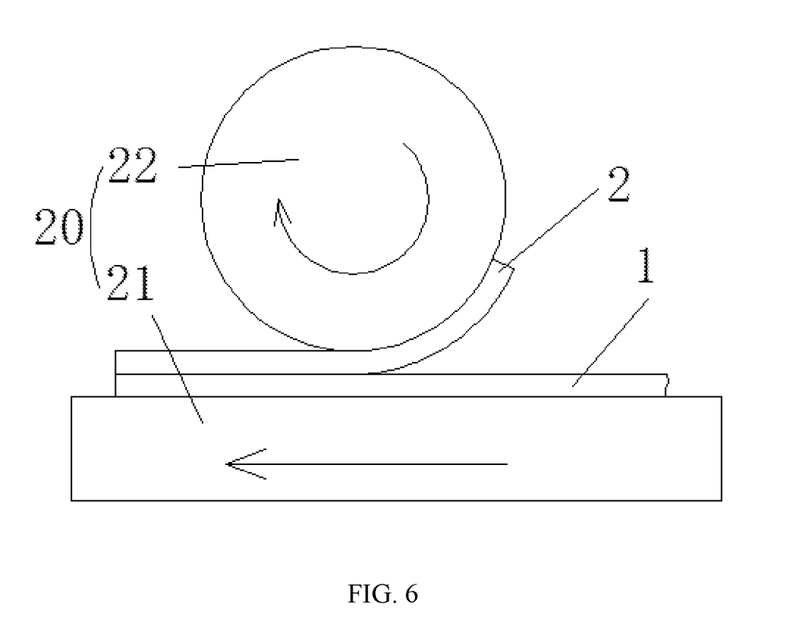
FIG. 6 is a schematic view of an attaching action between a flexible display panel and a transfer plate in a bonding method of a flexible display module provided in an embodiment of the present disclosure.

As a preferred embodiment of the present disclosure, referring to FIG. 6, in Step 1 of the bonding method of the flexible display module, the flexible display panel 1 and the transfer plate 2 can be attached in a transfer machine 20 through the following steps.

The flexible display panel 1 is flattened, and is placed on a transfer machine platform 21 of the transfer machine 20. A transfer wheel 22 of the transfer machine 20, absorbs the transfer plate 2 to an outer surface of the transfer wheel 22 through several vacuum suction holes, and the vacuum suction holes are sequentially released when the transfer wheel 22 rolls and presses onto the flexible display panel 1, so that the transfer plate 2 escapes from the transfer wheel 22 to be attached to the flexible display panel 1. As shown in FIG. 6, an arc-shaped arrow and a straight-line arrow in the figure represent movement directions of the transfer wheel 22 and the transfer machine platform 21, respectively.

When the flexible display panel 1 and the transfer plate 2 are attached through the above steps, the attached transfer plate 2 and flexible display panel 1 can be in relatively good flatness, therefore, the flattening action in Step 2 can be carried out more smoothly. It should be understood that although the flexible display panel 1 has been flatly placed on the transfer machine platform 21 after being attached to the transfer plate 2, the next step of the bonding method of the flexible display module is carried out in a bonding machine, therefore, the flexible display panel 1 and the transfer plate 2 may be moved, and bending or the like may occur in the moving process, consequently, before bonding alignment, the flattening action in Step 2 still needs to be performed to ensure the accuracy of alignment in the bonding alignment procedure.

Furthermore, after the attaching of the flexible display panel 1 to the transfer plate 2 is completed, firstly the transfer plate 2 can be moved out from the transfer machine platform 21, then the colloid facing the first bonding area 10 is solidified to form the fixed portion 30, and the solidifying action also can be performed directly on the transfer machine platform 21. Preferably, firstly the colloid of the first bonding area 10 is solidified to form the fixed portion 30, then the transfer plate 2 and the flexible display panel 1 are taken off from the transfer machine platform 21, ensuring that the first bonding area 10 and the transfer plate 2 are fixed with each other, preventing the first bonding area 10 from moving relative to the transfer plate 2 before the fixed portion 30 is formed, so as to avoid misplacement in subsequent bonding alignment.

Figure 7:
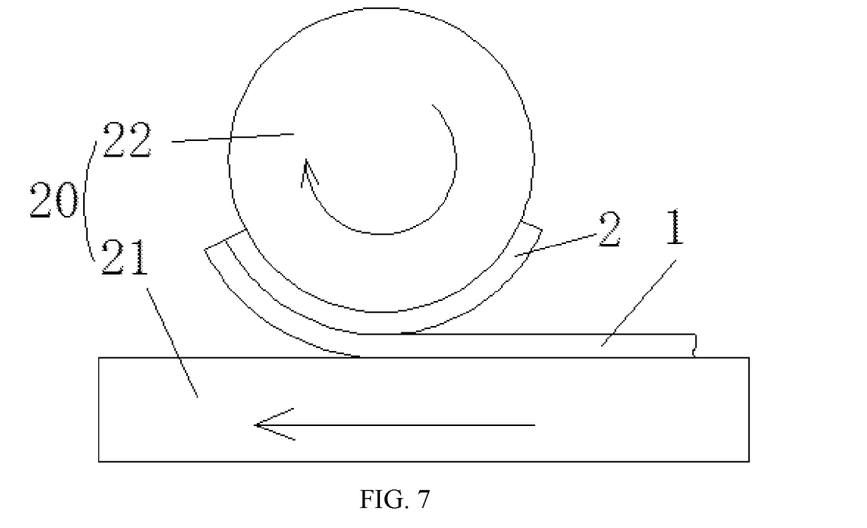
FIG. 7 is a schematic view of another attaching action between a flexible display panel and a transfer plate in a bonding method of a flexible display module provided in an embodiment of the present disclosure.

As another embodiment of the present disclosure, referring to FIG. 7, in Step 1 of the bonding method of the flexible display module, the flexible display panel 1 and the transfer plate 2 also can be attached in the transfer machine 20 through the following steps:

The flexible display panel 1 is flattened, and the flexible display panel 1 is absorbed, through several vacuum suction holes, to the transfer machine platform 21 of the transfer machine 20. An outer surface of the transfer wheel 22 of the transfer machine 20 is provided with the transfer plate 2. The vacuum suction holes are sequentially released when the transfer wheel 22 rolls and presses onto the flexible display panel 1, so that the flexible display panel 1 escapes from the transfer machine platform to be attached to the transfer plate 2.

It should be understood that after the attaching of the flexible display panel 1 to the transfer plate 2 is completed, firstly the transfer plate 2 can be moved out from the transfer wheel 22, then the colloid facing the first bonding area 10 is solidified to form the fixed portion 30, and the solidifying action also can be performed directly on the transfer wheel 22. Preferably, firstly the colloid of the first bonding area 10 is solidified to form the fixed portion 30, then the transfer plate 2 and the flexible display panel 1 are moved out from the transfer wheel 22, ensuring that the first bonding area 10 and the transfer plate 2 are fixed with each other, preventing the first bonding area 10 from moving relative to the transfer plate 2 before the fixed portion 30 is formed, so as to avoid misplacement in subsequent bonding alignment.

Furthermore, in Step 1 of the bonding method of the flexible display module, firstly the flexible display panel 1 is flattened, then the flexible display panel 1 is attached to the transfer plate 2, which can ensure that the first bonding area 10, in a flat state, and the transfer plate 2 are fixed with each other, thus in the subsequent process, even if no tensioning force is applied to the flexible display panel 1, the first bonding area 10 still can maintain a flat state as it is fixed with the transfer plate 2, facilitating subsequent process of bonding alignment.

Figure 8:
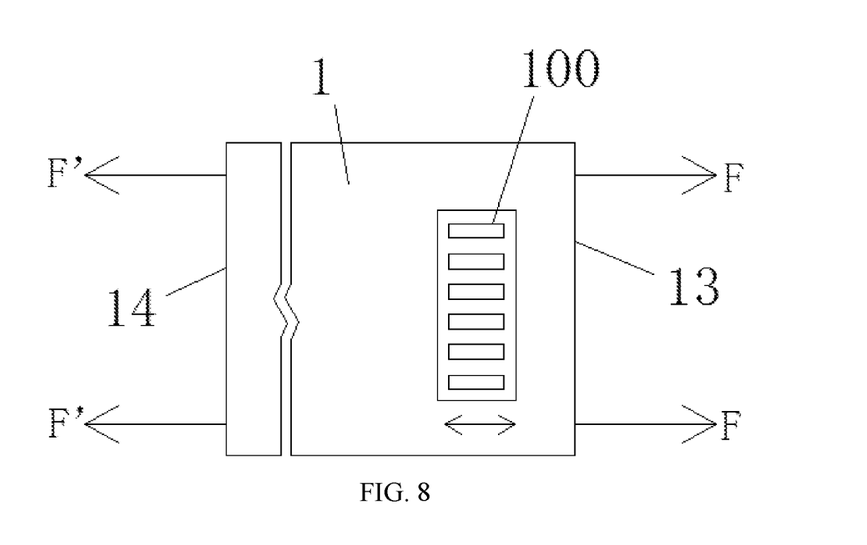
FIG. 8 is a schematic view of an action of flattening a flexible display panel in step 1 in a bonding method of a flexible display module provided in an embodiment of the present disclosure.

Meanwhile, referring to FIG. 8, the first bonding area 10 includes several strip solder pads 100. When the flexible display panel 1 is flattened, the solder pads 100 are tensioned in a length direction (such as a direction shown by a double sided arrow in FIG. 8) of the solder pads. Since the solder pads 100 are tensioned in their length direction, the distance between the adjacent solder pads 100 may not be changed in the tensioning action, facilitating smooth proceeding of subsequent process of bonding alignment. Specifically, a first tensioning force F and a second tensioning force F' can be respectively applied to opposite first peripheral side 13 and second peripheral side 14 of the flexible display panel 1 so as to tension the flexible display panel 1. Both the first peripheral side 13 and the second peripheral side 14 are perpendicular to the length direction of the solder pads 100. Directions of the first tensioning force F and the second tensioning force F' are opposite and both parallel to the length direction of the solder pads 100.

Furthermore, in Step 1 of the bonding method of the flexible display module, the colloid 3 is an abbreviation of ultraviolet ray (UV) curing adhesive. The ultraviolet ray curing adhesive is radiated by ultraviolet rays to form the fixed portion 30.

Furthermore, in Step 1 of the bonding method of the flexible display module, the colloid facing the first bonding area 10 can be solidified to form the fixed portion 30 through the following steps.

A patterned ultraviolet ray curing adhesive is formed on the transfer plate 2, and the ultraviolet ray curing adhesive is uniformly radiated by the ultraviolet rays to form the fixed portion 30.

Alternatively, the ultraviolet ray curing adhesive is uniformly coated on the transfer plate 2, and the ultraviolet ray is strictly controlled to merely radiate the ultraviolet ray curing adhesive of the first bonding area 10 to form the fixed portion 30.

It should be understood that the transfer plate 2 just needs to temporarily fix the flexible display panel 1, therefore, the colloid of the above fixed portion 30 does not need to be completely solidified, and it just needs to be solidified to such a condition that the first bonding area 10 do not move relative to the transfer plate 2. Therefore, when performing the solidification, weak ultraviolet rays can be used for the solidification, and the radiation time is appropriately decreased.

Furthermore, in Step 3 of the bonding method of the flexible display module, firstly an anisotropic conductive film (ACF) is attached to a bonding surface of the first bonding area 10 or a bonding surface of the second bonding area 40, then the first bonding area 10 and the second bonding area 40 are aligned and pre-laminated. The anisotropic conductive film is used to realize the electrical connection of the first bonding area 10 and the second bonding area 40.

Figure 9:
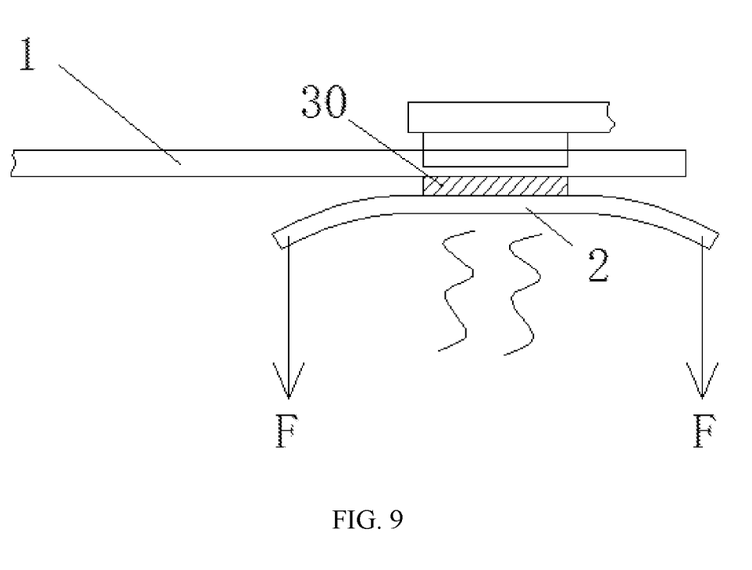
FIG. 9 is a schematic view of an action of stripping a flexible display panel from a transfer plate in a bonding method of a flexible display module provided in an embodiment of the present disclosure.

Furthermore, referring to FIG. 9, in Step 4 of the bonding method of the flexible display module, the fixed portion 30 can be broken through the following steps so as to separate the flexible display panel 1 and the transfer plate 2.

A force F away from the flexible display panel 1 is applied to a peripheral side of the transfer plate 2, so that areas of the transfer plate 2, with the exception of a portion connected with the fixed portion 30, are separated from the flexible display panel 1.

The fixed portion 30 is heated to cause the fixed portion 30 to lose viscosity, so as to separate the flexible display panel 1 and the transfer plate 2.

In the above steps, the object of heating the fixed portion 30 can be achieved by directly heating the fixed portion 30, and also can be achieved by heating the transfer plate 2 which transfers the heat to the fixed portion 30. When the transfer plate 2 is heated, firstly most of the areas of the transfer plate 2 are separated from the flexible display panel 1, which can avoid damages to the flexible substrate, circuits, and electronic devices of the flexible display panel 1 caused by high temperature when the transfer plate 2 is heated. Moreover, since just the colloid 3 facing the first bonding area 10 is solidified to form the fixed portion 30, even if the colloid 3 includes portions other than the fixed portion 30, it still can be easily torn under the effect of the force F, that is, the areas of the transfer plate 2, with the exception of the portions connected with the fixed portion 30, can be easily separated from the flexible display panel 1 under the effect of the force F.

It should be understood that in the embodiments of the present disclosure, the fixed portion 30 also can be broken through other non-contact methods, for example, laser radiation.

Figure 10:
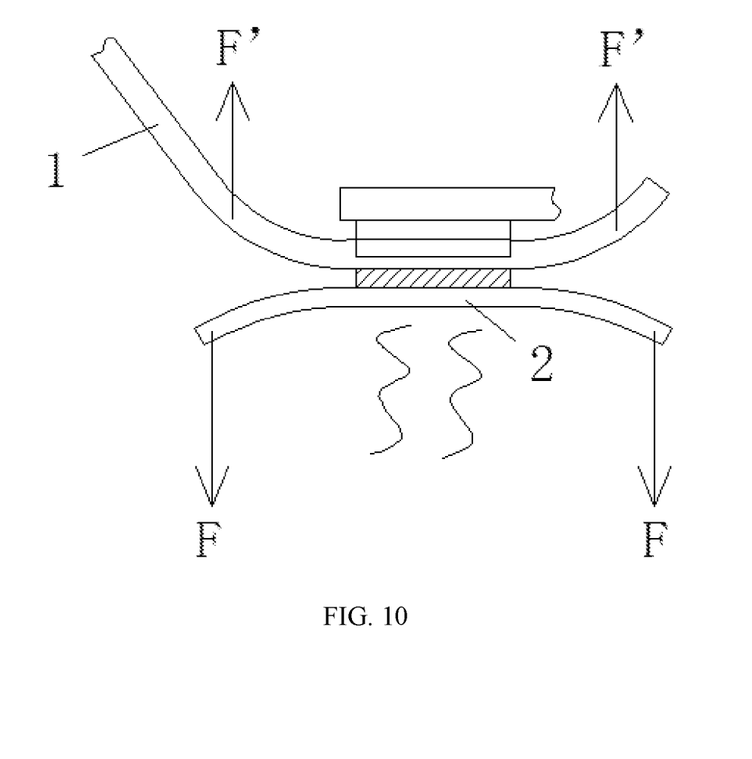
FIG. 10 is a schematic view of another action of stripping the flexible display panel from the transfer plate in a bonding method of a flexible display module provided in an embodiment of the present disclosure.

Furthermore, referring to FIG. 10, at the same time the force F' away from the transfer plate 2 can be applied to a peripheral side of the flexible display panel 1, so that the transfer plate 2 and the flexible display panel 1 are separated more thoroughly, facilitating stripping the flexible display panel 1 smoothly from the transfer plate 2.

Furthermore, the transfer plate 2 is of a material which can be bent and resilient in certain situations and has good thermal conductivity. Preferably, the transfer plate 2 can be made of metal sheet material or soft glass material.

Figure 5:
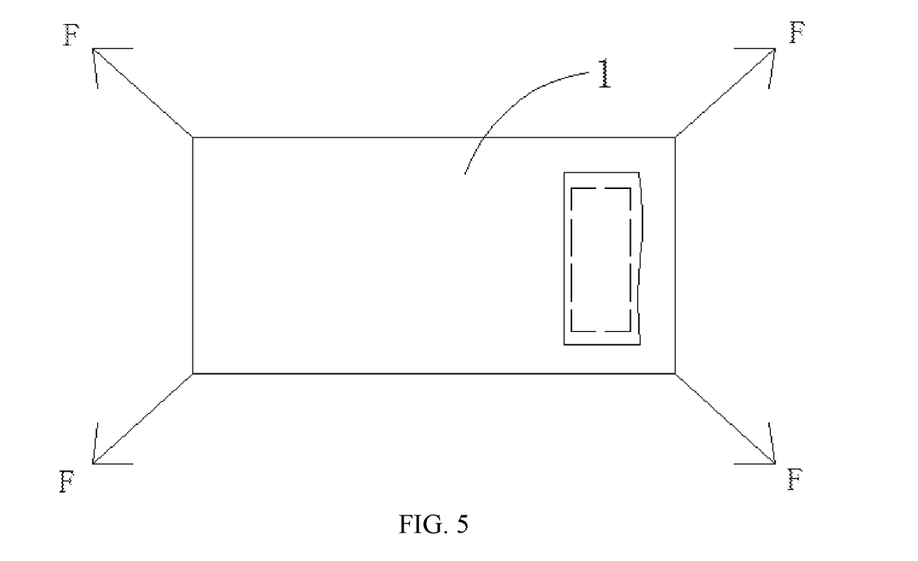

Preferably, as shown in FIG. 5, in Step 5 of the bonding method of the flexible display module, when flattening the flexible display panel 1, the tensioning force F can be applied to four corners of the flexible display panel 1, to tension the flexible display panel 1 according to directions pointed by arrows (i.e., directions away from the center of the flexible display panel 1). The flattened flexible display panel 1 maintains good flatness, therefore, an area of the flexible display panel 1, which needs to be laminated, can be completely and tightly attached to a platform for performing the lamination, so that the first bonding area 10 and the second bonding area 40 can be uniformly heated in the laminating process, further ensuring the alignment accuracy and the bonding quality of the first bonding area 10 and the second bonding area 40.

The bonding method of the flexible display module provided in the embodiments of the present disclosure is introduced in detail in the above. Specific examples are used in the present text to illustrate the principle and the embodiments of the present disclosure. The above description of the embodiments is merely used to facilitate understanding of the method of the present disclosure and the core idea thereof. Meanwhile, for a person ordinarily skilled in the art, modifications can be made to the specific embodiments and application range according to the thought of the present disclosure. To sum up, the contents in the present specification should not be construed as limiting the present disclosure.

What is claimed is:

1. A bonding method of a flexible display module, the flexible display module comprising a flexible display panel having a first bonding area and an integrated driving circuit having a second bonding area, the bonding method comprising:

attaching, through a colloid, a transfer plate to a surface of the flexible display panel which is away from the first bonding area;

solidifying the colloid facing the first bonding area to form a fixed portion;

flattening the transfer plate to flatten the first bonding area through the fixed portion;

aligning the second bonding area with the first bonding area;

pre-laminating the first bonding area and the second bonding area at a first temperature;

breaking the fixed portion, and separating the flexible display panel and the transfer plate;

flattening the flexible display panel; and
laminating the first bonding area and the second bonding area at a second temperature.

2. The bonding method of the flexible display module of claim 1, wherein attaching, through the colloid, the transfer plate to the surface of the flexible display panel which is away from the first bonding area comprises:
 flattening the flexible display panel and placing the flexible display panel on a transfer machine platform, a transfer wheel comprising vacuum suction holes, absorbing, through the vacuum suction holes, the transfer plate to an outer surface of the transfer wheel, and releasing the vacuum suction holes sequentially when the transfer wheel rolls and presses onto the flexible display panel, so that the transfer plate escapes from the transfer wheel and is attached to the flexible display panel.

3. The bonding method of the flexible display module of claim 1, wherein attaching, through the colloid, the transfer plate to the surface of the flexible display panel which is away from the first bonding area comprises:
 flattening the flexible display panel, a transfer machine platform comprising vacuum suction holes, absorbing, through the vacuum suction holes, the flexible display panel to the transfer machine platform, an outer surface of the transfer wheel being provided with a transfer plate, and releasing the vacuum suction holes sequentially when the transfer wheel rolls and presses onto the flexible display panel, so that the flexible display panel escapes from the transfer machine platform and is attached to the transfer plate.

4. The bonding method of the flexible display module of claim 2, wherein flattening the flexible display panel comprises:
 the first bonding area setting strip solder pads, tensioning the solder pads in a length direction of the solder pads.

5. The bonding method of the flexible display module of claim 4, wherein tensioning the solder pads comprises:
 the flexible display panel comprising a first peripheral side and a second peripheral side opposite to the first peripheral side, the first peripheral side and the second peripheral side both being perpendicular to the length direction of the solder pads;
 applying a first tensioning force to the first peripheral side, applying a second tensioning force to the second peripheral side, directions of the first tensioning force and the second tensioning force being opposite, and both parallel to the length direction of the solder pads.

6. The bonding method of the flexible display module of claim 1, wherein solidifying the colloid facing the first bonding area to form the fixed portion comprises:
 radiating the colloid by ultraviolet rays to form the fixed portion, the colloid being an ultraviolet ray curing adhesive.

7. The bonding method of the flexible display module of claim 6, wherein radiating the colloid by the ultraviolet rays comprises: radiating the colloid which is patterned uniformly by the ultraviolet rays.

8. The bonding method of the flexible display module of claim 6, wherein radiating the colloid by the ultraviolet rays comprises: radiating the colloid uniformly coated on the transfer plate by an angle facing the first bonding area via the ultraviolet rays.

9. The bonding method of the flexible display module of claim 1, wherein breaking the fixed portion, and separating the flexible display panel and the transfer plate comprises:
 applying a force away from the flexible display panel to a peripheral side of the transfer plate, so that areas of the transfer plate, with the exception of a portion connected with the fixed portion, are separated from the flexible display panel; and
 heating or laser-radiating the fixed portion to cause the fixed portion to lose viscosity, so as to separate the flexible display panel and the transfer plate.

10. The bonding method of the flexible display module of claim 1, wherein breaking the fixed portion, and separating the flexible display panel and the transfer plate comprises:
 applying a force away from the flexible display panel to a peripheral side of the transfer plate, and applying a force away from the transfer plate to a peripheral side of the flexible display panel, so that areas of the transfer plate, with the exception of a portion connected with the fixed portion, are separated from the flexible display panel; and
 heating or laser-radiating the fixed portion to cause the fixed portion to lose viscosity, so as to separate the flexible display panel and the transfer plate.

11. The bonding method of the flexible display module of claim 3, wherein flattening the flexible display panel comprises:
 the first bonding area setting strip solder pads, tensioning the solder pads in a length direction of the solder pads.

* * * * *